(12) United States Patent
Kim et al.

(10) Patent No.: US 12,040,788 B2
(45) Date of Patent: Jul. 16, 2024

(54) ULTRAHIGH FREQUENCY TRAVELING-WAVE SWITCH

(71) Applicant: Korea Electronics Technology Institute, Seongnam-si (KR)

(72) Inventors: Ki Jin Kim, Yongin-si (KR); Kwang Ho Ahn, Yongin-si (KR); Soo Chang Chae, Changwon-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 21 days.

(21) Appl. No.: 17/623,040

(22) PCT Filed: Dec. 12, 2019

(86) PCT No.: PCT/KR2019/017550
§ 371 (c)(1),
(2) Date: Dec. 27, 2021

(87) PCT Pub. No.: WO2021/117935
PCT Pub. Date: Jun. 17, 2021

(65) Prior Publication Data
US 2022/0271749 A1     Aug. 25, 2022

(30) Foreign Application Priority Data

Dec. 11, 2019    (KR) ........................ 10-2019-0164317

(51) Int. Cl.
*H03K 17/693*      (2006.01)
*H03K 17/687*      (2006.01)

(52) U.S. Cl.
CPC ....... *H03K 17/693* (2013.01); *H03K 17/6871* (2013.01)

(58) Field of Classification Search
CPC ............. H03K 17/693; H03K 17/6871; H03K 2017/066; H03K 17/162; H03K 17/687; H04B 1/44; H01L 2924/1033
See application file for complete search history.

(56) References Cited

U.S. PATENT DOCUMENTS

| | | | |
|---|---|---|---|
| 7,893,791 B2 * | 2/2011 | Ma ............................ | H01P 1/15 333/134 |
| 2010/0244985 A1 * | 9/2010 | Chang ........................ | H01P 1/15 333/175 |

FOREIGN PATENT DOCUMENTS

| | | |
|---|---|---|
| JP | 2016-10045 A | 1/2016 |
| KR | 10-2006-0094005 A | 8/2006 |

(Continued)

OTHER PUBLICATIONS

Korean Office Action Issued on Oct. 13, 2022, in counterpart Korean Patent Application No. 10-2019-0164317 (5 Pages in Korean, 3 Pages in English).

(Continued)

*Primary Examiner* — Metasebia T Retebo
(74) *Attorney, Agent, or Firm* — NSIP Law

(57) ABSTRACT

Provided is a switch having a structure having an excellent isolation characteristic even without a limiter in an ultrahigh frequency hand used for a military component. A switch according to an embodiment of the present invention comprises: multiple transistors which are connected in parallel to a path from an input terminal toward an output terminal and perform switching; and a first transmission line provided between the input terminal and a node on a path to which a first transistor is connected. By the present invention, switching can be performed in an ultrahigh frequency such as W-band while a GaN transistor is used, an insertion loss is low, an isolation characteristic is excellent, and eventually (Continued)

efficiency of an ultrahigh frequency circuit can be further enhanced.

7 Claims, 9 Drawing Sheets

(56) References Cited

FOREIGN PATENT DOCUMENTS

| KR | 10-0611107 B1 | | 8/2006 |
|---|---|---|---|
| KR | 100611107 B1 | * | 8/2006 |
| KR | 20060094005 A | * | 8/2006 |
| KR | 10-2009-0033618 A | | 4/2009 |
| KR | 10-0983794 B1 | | 9/2010 |
| KR | 10-2011-0068595 A | | 6/2011 |
| WO | WO-2018109896 A1 | * | 6/2018 |

OTHER PUBLICATIONS

Korean Office Action issued on Apr. 3, 2023, in counterpart Korean Patent Application No. 10-2019-0164317 (3 pages in English, 4 pages in Korean).

* cited by examiner

ULTRAHIGH FREQUENCY TRAVELING-WAVE SWITCH

CROSS REFERENCE TO RELATED APPLICATIONS

This application is a U.S. National Stage Application of International Application No. PCT/KR2019/017550, filed on Dec. 12, 2019, which claims the benefit under 35 USC 119(a) and 365(b) of Korean Patent Application No. 10-2019-0164317, filed on Dec. 11, 2019, in the Korean Intellectual Property Office, the entire disclosure of which is incorporated herein by reference for all purposes.

TECHNICAL FIELD

The present disclosure relates to a switching element, and more particularly, to a switch which is capable of operating in an ultrahigh frequency band.

BACKGROUND ART

A gallium nitride (GaN) device is an element that has a high breakdown voltage and thermal conductivity and is suitable for a high-power device. Even when the GaN device is used as a switch, these characteristics are applied and the GaN device has high linearity and switches high power. Therefore, the GaN device has advantages that a circuit does not operate or performance is not degraded even when a circuit like a limiter is not additionally connected.

However, in order to have such a high breakdown voltage, the GaN device has a wider gap between a source and a drain than a normal high electron mobility transistor (HEMT) element, and accordingly, has many parasitic components and a high on-resistance, and has its function as a switch degraded, compared to other compound semiconductors.

FIG. 1 illustrates a structure of a switch which is used up to 10 GHz. Q1, Q2 indicate series switches and operate in such a manner that, when Q1 is turned on, Q3, Q4 are turned on. Q1 has many parasitic components as described above and thus has many insertion losses compared to other devices. Accordingly, L1 should be insert to compensate for the parasitic components as shown in FIG. 1. The parallel switch made by Q3, Q4 may not have a good switch characteristic of suppressing signals, but may minimize sacrifice of the insertion loss caused by the parasitic components. Accordingly, the above-described structure is widely used.

FIG. 2 illustrates a configuration of a switch that is formed of only a parallel switch. Such a parallel connection GaN switch may have less parasitic components than those appearing in a series structure, and thus may increase an operating frequency (a band of 30-40 GHz).

However, since the parallel switch does not have a series structure, there is a problem in isolation between port 1 and port 2 and this switch may not be used in a system requiring isolation of 30 dB or higher. Also, such a switch may not be used in a high frequency like 90 GHz (see FIG. 3).

A faster device may be required to switch in a high speed circuit like W band. FIG. 4 is a photo of a switch which uses a GaAs PIN diode. This switch has a basic structure like the parallel structure shown in FIG. 2, and has a changed structure which uses a PIN diode instead of a transistor.

FIG. 5 illustrates the insertion loss and the isolation of the switch shown in FIG. 4, and in FIG. 5, the insertion loss is about 1.5 dB and the isolation loss is about 8 dB. It can be seen that the insertion loss is the extent to which the switch can be used, but the isolation characteristic is not satisfied.

DISCLOSURE

Technical Problem

The present disclosure has been developed in order to address the above-discussed deficiencies of the prior art, and an object of the present disclosure is to provide a switch of a structure which has an excellent isolation characteristic even without a limiter in an ultrahigh frequency band used for a military component.

Technical Solution

According to an embodiment of the present disclosure to achieve the above-described object, a switch includes: a plurality of transistors which are connected in parallel to a path from an input terminal to an output terminal and are switched; and a first transmission line which is provided between the input terminal and a node on the path to which a first transistor is connected.

The switch may include a second transmission line which is provided between a node on the path to which a last transistor is connected, and the output terminal.

The first transmission line and the second transmission line may have a length of λ/4.

The transistors may be connected to nodes on the path through third transmission lines.

The transistors may be GaN transistors.

Inductances of the third transmission lines may be values that cause the GaN transistors in an ultrahigh frequency to operate as resistances in an on-state, and to operate as capacitors in an off-state.

The switch may further include fourth transmission lines which are provided between nodes on the path to which the transistors are connected, respectively.

According to another aspect of the present disclosure, there is provided a switch including: a plurality of transistors which are connected in parallel to a path from an input terminal to an output terminal, and are switched; and a second transmission line which is provided between a node on the path to which a last transistor is connected, and the output terminal.

Advantageous Effects

According to embodiments of the present disclosure as described above, switching can be performed in an ultrahigh frequency like W-band while a GaN transistor is used, insertion loss and isolation characteristics are excellent, and eventually, efficiency of an ultrahigh frequency circuit can be further enhanced.

BEST MODE

Hereinafter, the present disclosure will be described in more detail with reference to the accompanying drawings.

Embodiments of the present disclosure provide a structure of an ultrahigh frequency traveling wave switch which uses a GaN transistor.

The traveling wave switch according to an embodiment of the present disclosure is capable of operating in an ultrahigh frequency such as W-band while using a GaN transistor, and has excellent insertion loss and isolation characteristics.

Figure 1:
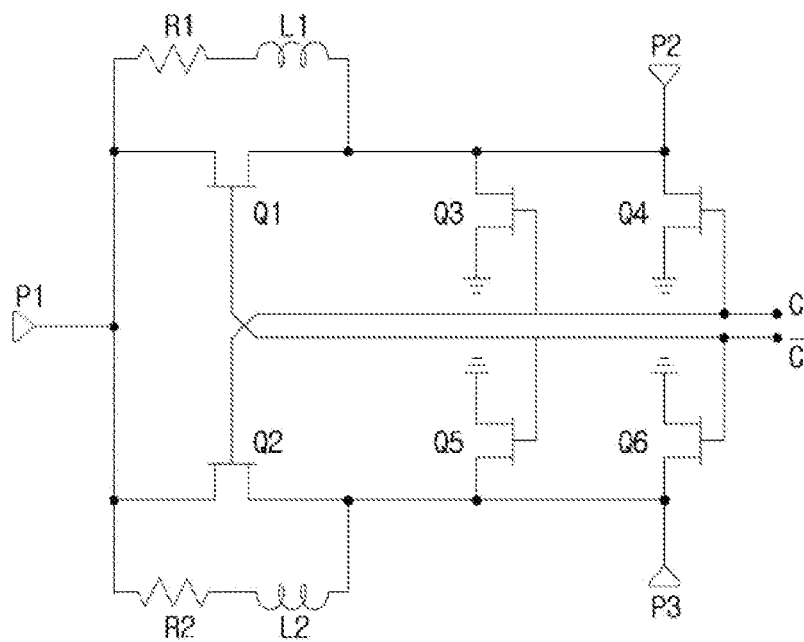
FIG. 1 is a view of a normal GaN-based switch structure.
Figure 2:
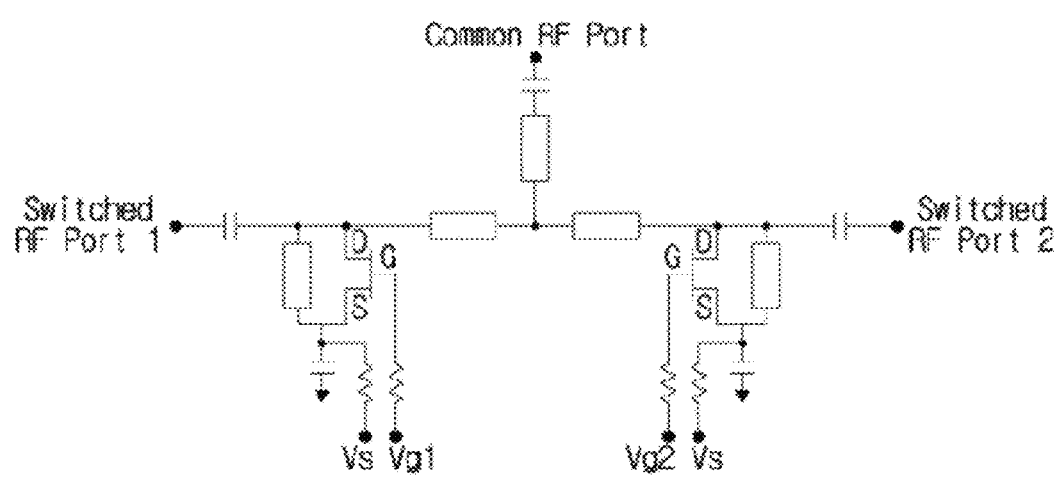
FIG. 2 is a view of a GaN switch which is only configured in parallel.
Figure 3:
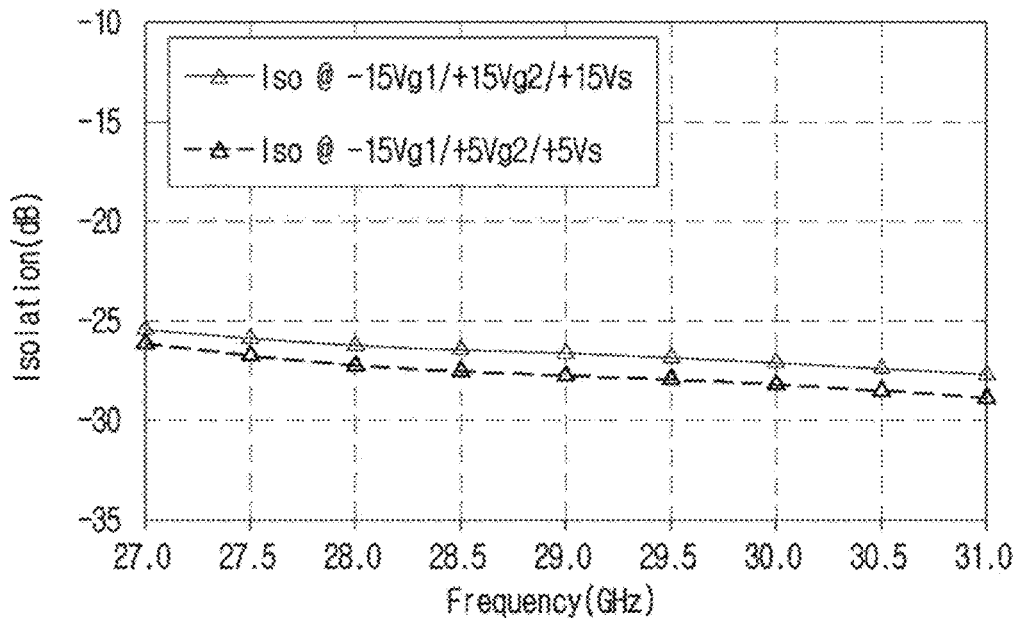
FIG. 3 is a view illustrating isolation of a switch which is configured with a parallel transistor.
Figure 4:
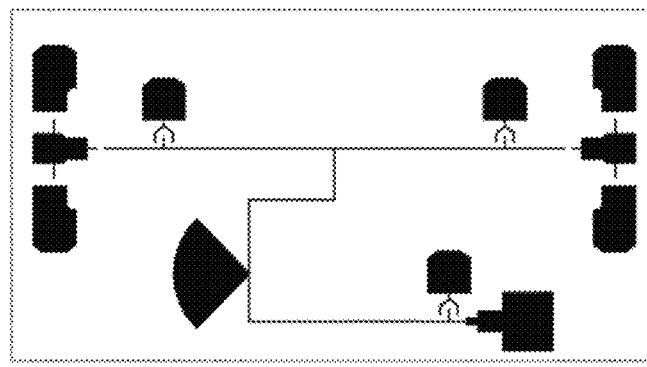
FIG. 4 is a view illustrating a W band switch which uses a PIN diode.
Figure 5:
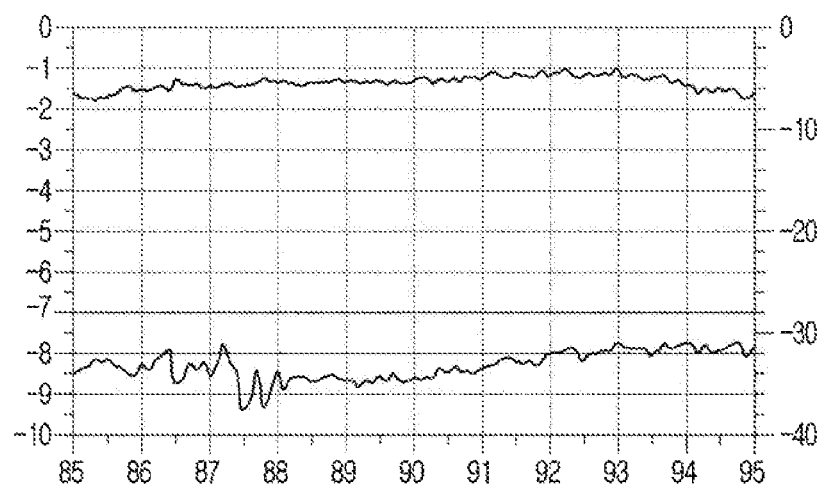
FIG. 5 is a view illustrating an insertion loss and isolation.
Figure 6:
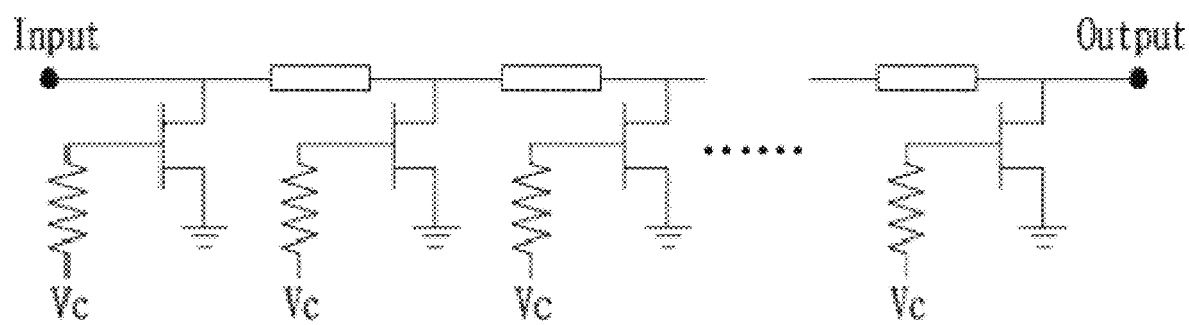
FIG. 6 is a view illustrating a structure of a traveling wave switch to which the present disclosure is applicable.

FIG. 6 is a view illustrating a structure of a traveling wave switch to which the present disclosure is applicable.

In the traveling wave switch illustrated, when the GaN transistor is turned off, the GaN transistor operates as a capacitance to make a transmission line, which is formed of inductance-capacitance-inductance (LCL), along with an inductance L of the transmission line, and to allow a signal inputted to an input terminal to travel to an output terminal therethrough.

On the other hand, when the GaN transistor is turned on, the GaN transistor may be short-circuited to prevent an input signal from traveling to the output terminal. Since there are a plurality of short circuit lines formed by the GaN transistor in FIG. 6, signal isolation is excellent.

Figure 7:
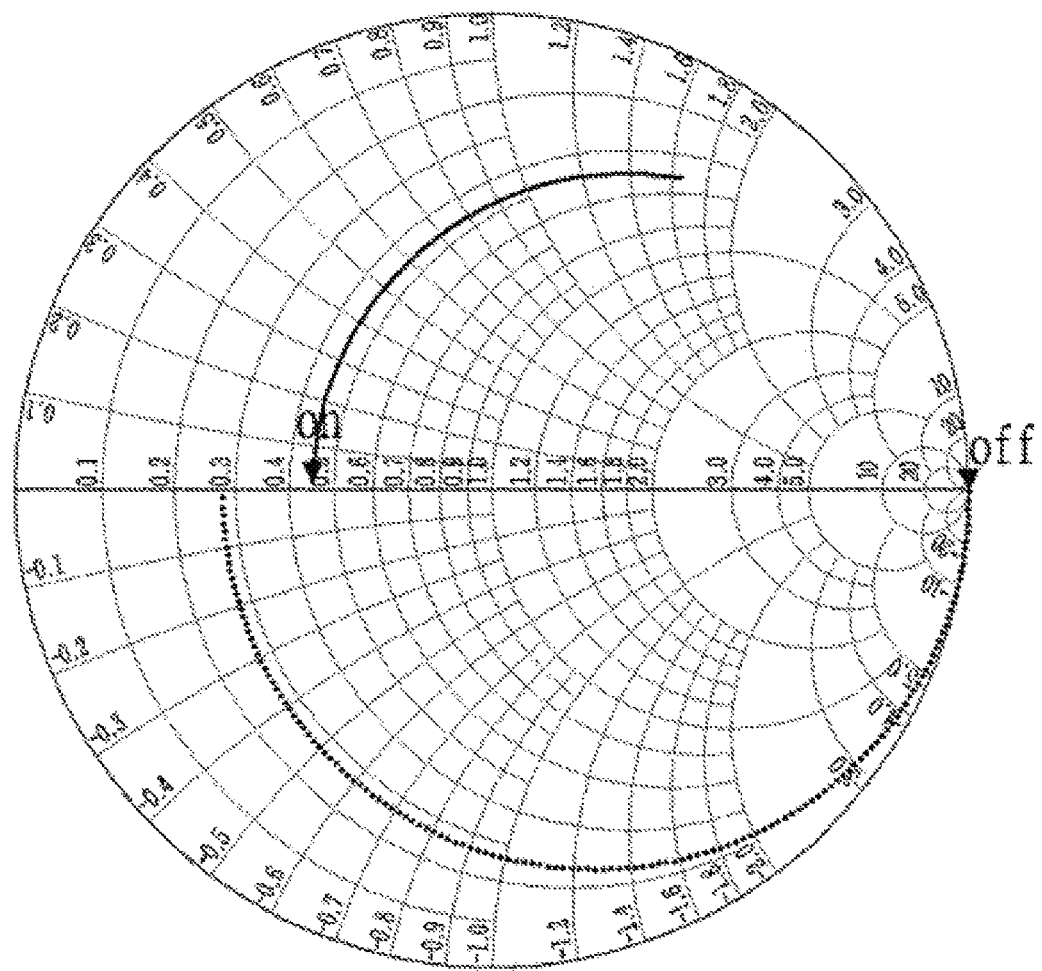
FIG. 7 is a view illustrating on-off characteristics of a GaN transistor.

FIG. 7 illustrates on-off characteristics of the GaN transistor according to a frequency. On the chart of FIG. 7, the position of the marker is 1 GHz and the end of the line is 100 GHz.

Ideal characteristics of the GaN transistor are that the GaN transistor has 0Ω in an on-state and has an infinite resistance in an off-state. As shown in FIG. 7, in a low frequency, the GaN transistor has 25Ω in the on-state and is opened in the off-state. However, in an ultrahigh frequency such as 100 GHz, the GaN transistor goes into a series-connection state of inductance with 100Ω in the on-state, and is 15Ω in the off-state.

The above-described characteristics in the ultrahigh frequency occur due to large parasitic components of the GaN device, and make it difficult to use the GaN transistor in an ultrahigh frequency switch.

A method for solving the above-described problem, that is, for designing an ultrahigh frequency switch by using a GaN transistor, will be described in detail hereinbelow.

Figure 8:
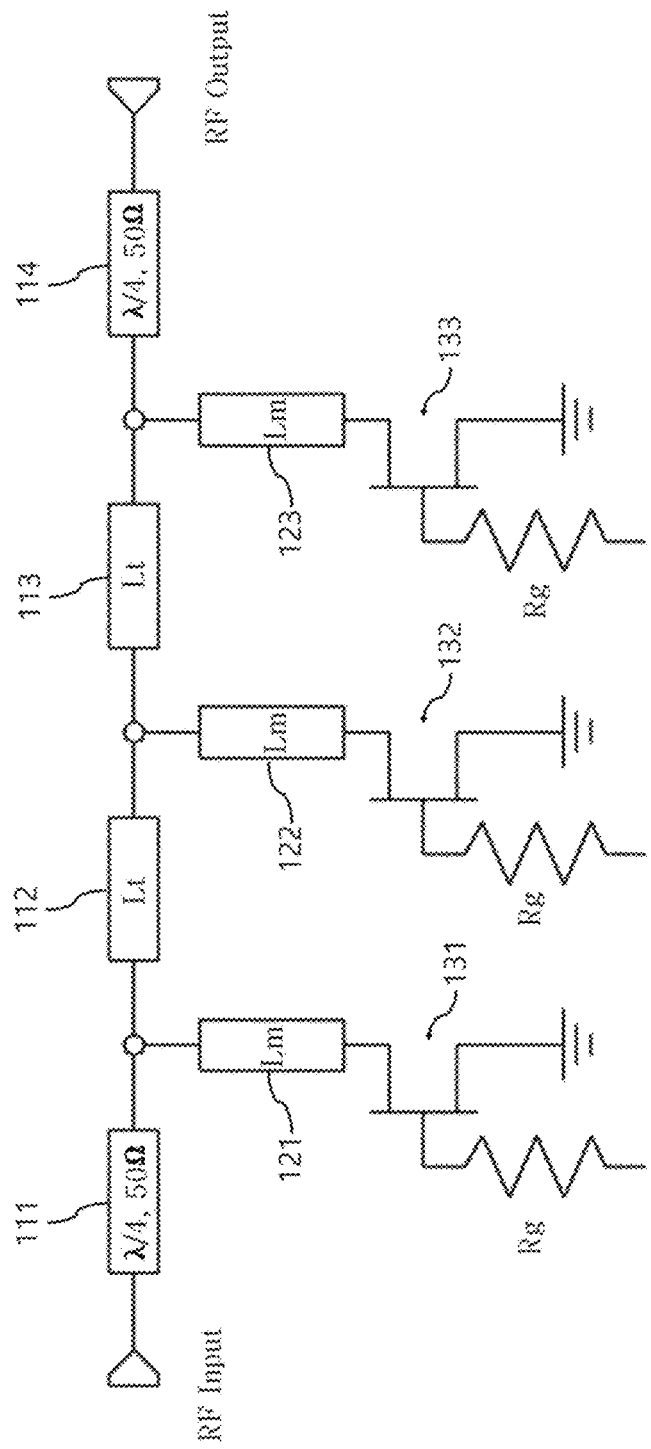
FIG. 8 is a view illustrating a structure of a traveling wave switch according to an embodiment of the present disclosure.
Figure 9:
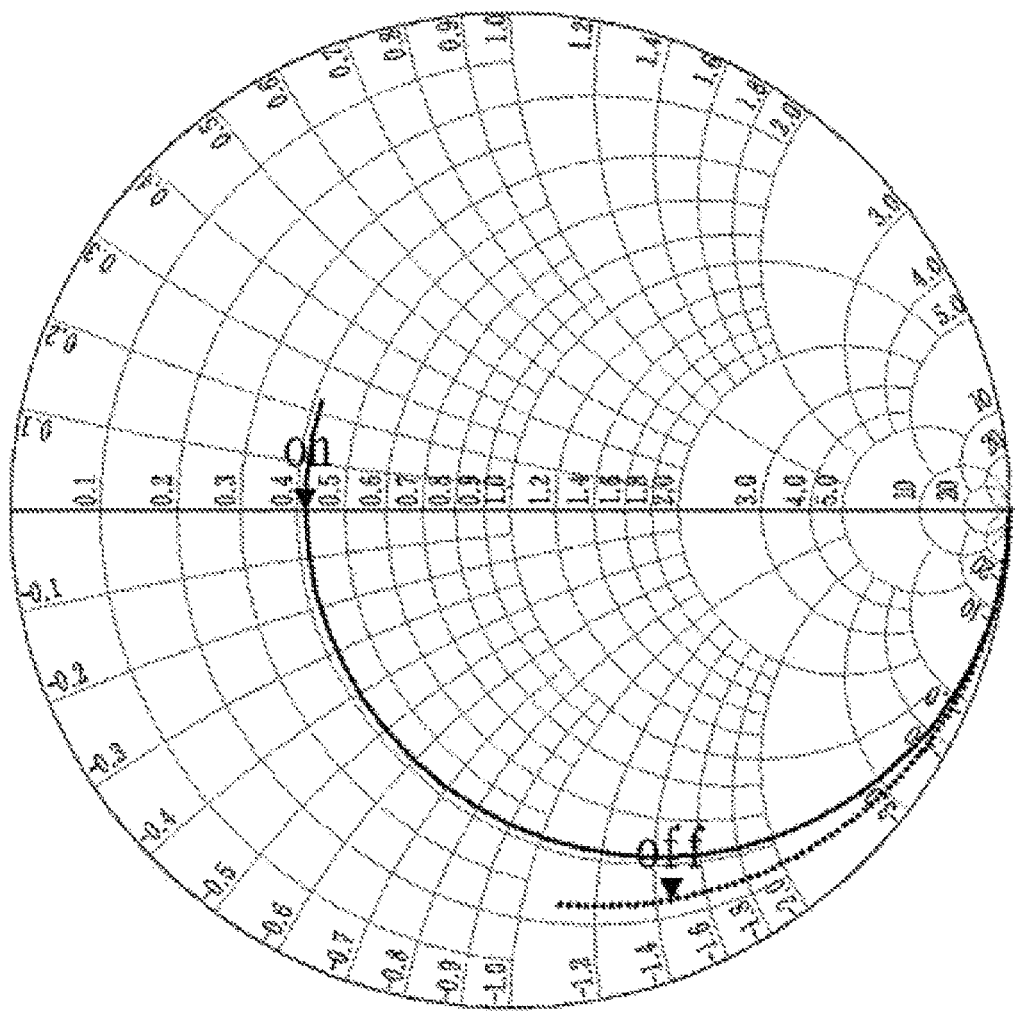
FIG. 9 is a view illustrating on-off characteristics of an enhanced GaN transistor.

FIG. 8 is a view illustrating a structure of a traveling wave switch according to an embodiment of the present disclosure. The traveling wave switch according to an embodiment of the present disclosure is designed to have high performance in an ultrahigh frequency band although the traveling wave switch uses a GaN transistor.

As shown in FIG. 8, the traveling wave switch according to an embodiment of the present disclosure includes transmission lines 111 to 114 constituting a signal transmission path from an input terminal RF Input to an output terminal RF Output, transmission lines 121 to 123 connected in parallel on the signal transmission path, GaN transistors 131 to 133, and gate resistances Rg.

The GaN transistors 131 to 133 are connected in parallel on the signal transmission path going from the input terminal to the output terminal. The GaN transistors 131 to 133 may be switched on/off according to a control signal inputted through the gate resistances Rg.

Three GaN transistors 131 to 133, that is, a 3-stage switch, is implemented to sufficiently ensure isolation between the input terminal and the output terminal. The traveling wave switch may be implemented by more GaN transistors if necessary, and in this case, the technical concept of the present disclosure may be applied as it is.

The first transmission line 111 is a transmission line that is provided between the input terminal RF Input and a node on the signal transmission path to which the first GaN transistor 121 is connected, and has a length of λ/4 and impedance of 50Ω.

The last transmission line 114 is a transmission line that is provided between a node on the signal transmission path to which the last GaN transistor 123 is connected, and the output terminal RF Output, and has a length of λ/4 and impedance of 50Ω.

Accordingly, when the GaN transistors 121 to 123 are turned on, the switch is opened by the first transmission line 111 and the last transmission line 114 as viewed from the input terminal and the output terminal, so that the traveling wave switch can more stably operate when being connected with an external circuit.

The transmission lines 121 to 123 are positioned between the GaN transistors 131 to 133 and the signal transmission path. That is, the GaN transistors 131 to 133 are connected with the nodes on the signal transmission path through the transmission lines 121 to 123

The on-off characteristics the GaN transistors 131 to 133 may be enhanced by adjusting inductances Lm of the transmission lines 121 to 123 appropriately.

Specifically, the inductances Lm of the transmission lines 121 to 123 are determined, so that, when the GaN transistors 131 to 133 are turned on in an ultrahigh frequency of 90 GHz, the GaN transistors operate as resistances as in a low frequency, and, when the GaN transistors are turned off, the GaN transistors operate as capacitors.

When the GaN transistors 131 to 133 are turned off and operate as capacitors, the GaN transistors make transmission lines which are formed of LCL even in an ultrahigh frequency, and allow signals inputted to the input terminal to travel to the output terminal therethrough.

The transmission lines 112, 113 are transmission lines that are provided between nodes on the signal transmission path to which the GaN transistors 131 to 133 are connected. Inductances Lt of the transmission lines 112, 113 are determined according to enhanced characteristics of the GaN transistors 131 to 133.

Figure 10:
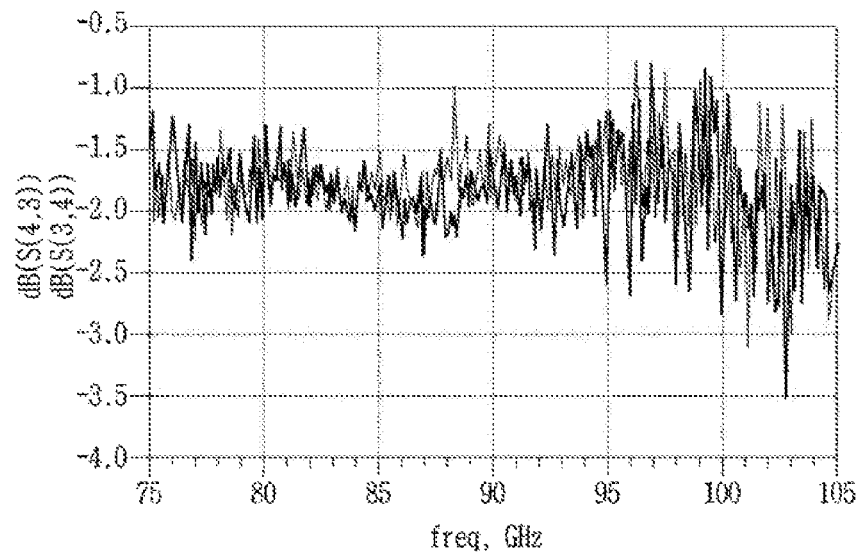
FIG. 10 is a view illustrating a result of measuring an insertion loss.
Figure 11:
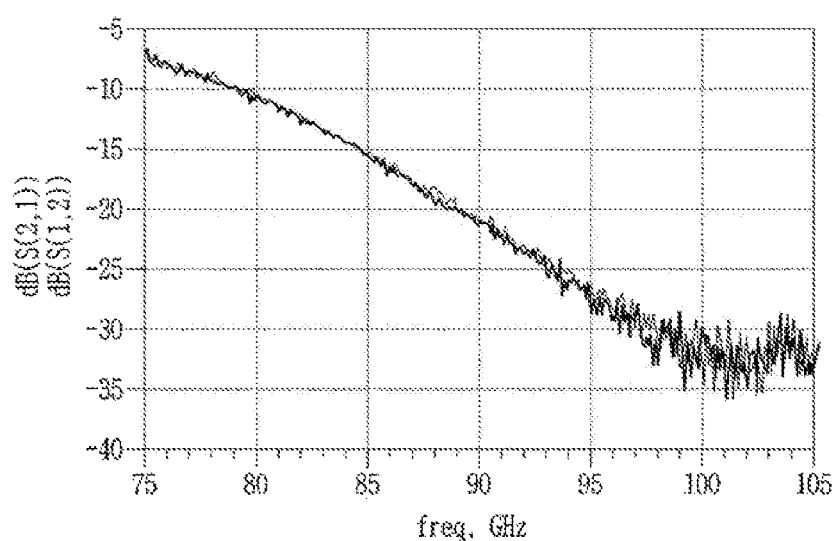
FIG. 11 is a view illustrating a result of measuring an isolation loss.

Results of testing the traveling wave switch really fabricated according to an embodiment of the present disclosure are illustrated in FIGS. 10 and 11. FIG. 10 illustrates a result of measuring an insertion loss, and FIG. 11 illustrates a result of measuring an isolation loss.

As shown in FIGS. 10 and 11, the insertion loss of the traveling wave switch really fabricated according to an embodiment of the present disclosure measured 2 dB or less, and the isolation loss measured 30 dB or more.

Power could not be measured due to limitation to measurement equipment, but it is estimated that high-power characteristics can be sufficiently obtained since the GaN transistors are used.

Up to now, the ultrahigh traveling wave switch using the GaN transistors has been described in detail with reference to preferred embodiments.

In embodiments of the present disclosure, the traveling wave switch which can be switched in an ultrahigh frequency such as W-band without a limiter while using a GaN transistor, and has excellent insertion loss and isolation characteristics is designed.

Accordingly, efficiency of an ultrahigh frequency circuit used for a military component can be further enhanced.

The traveling wave switch according to an embodiment of the present disclosure may be widely applied to other ultrahigh frequency communication components as well as military radar components, specifically, a seeker in a cannonball.

In addition, while preferred embodiments of the present disclosure have been illustrated and described, the present disclosure is not limited to the above-described specific embodiments. Various changes can be made by a person skilled in the art without departing from the scope of the present disclosure claimed in claims, and also, changed embodiments should not be understood as being separate from the technical concept or prospect of the present disclosure.

The invention claimed is:

1. A switch comprising:
   at least three transistors which are connected in parallel to a path from an input terminal to an output terminal and are switched; and
   a first transmission line which is provided between the input terminal and a node on the path to which a first transistor, of the at least three transistors, is connected,
   wherein the at least three transistors are connected to nodes on the path through third transmission lines,
   wherein an on-off state of the first transistor is determined by adjusting a corresponding inductance of the third transmission lines, and
   wherein inductances of the third transmission lines cause the at least three transistors in an ultrahigh frequency to operate as resistances in an on-state, and to operate as capacitors in an off-state;
   a fourth transmission line which is provided between the first transistor and a second transistor, of the at least three transistors, on the path; and
   a fifth transmission line which is provided between the second transistor and a last transistor, of the at least three transistors, on the path,
   wherein inductances of the fourth transmission line and the fifth transmission line are determined according to enhanced characteristics of the at least three transistors.

2. The switch of claim 1, comprising a second transmission line which is provided between a node on the path to which the last transistor, of the at least three transistors, is connected, and the output terminal.

3. The switch of claim 2, wherein the first transmission line and the second transmission line have a length of $\lambda/4$.

4. The switch of claim 1, wherein the transistors are GaN transistors.

5. A switch comprising:
   at least three transistors which are connected in parallel to a path from an input terminal to an output terminal, and are switched;
   a first transmission line which is provided between the input terminal and a node on the path to which a first transistor, of the at least three transistors, is connected;
   a second transmission line which is provided between a node on the path to which a last transistor, of the plurality of transistors, is connected, and the output terminal,
   wherein the at least three transistors are connected to nodes on the path through third transmission lines,
   wherein an on-off state of the last transistor is determined by adjusting a corresponding inductance of the third transmission lines, and
   wherein inductances of the third transmission lines cause the plurality of transistors in an ultrahigh frequency to operate as resistances in an on-state, and to operate as capacitors in an off-state;
   a fourth transmission line which is provided between the first transistor and a second transistor, of the at least three transistors, on the path; and
   a fifth transmission line which is provided between the second transistor and a last transistor, of the at least three transistors, on the path,
   wherein inductances of the fourth transmission line and the fifth transmission line are determined according to enhanced characteristics of the at least three transistors.

6. The switch of claim 5, wherein the first transmission line and the second transmission line have a length of $\lambda/4$.

7. The switch of claim 5, wherein the plurality of transistors are GaN transistors.

* * * * *